(12) United States Patent
Sasagawa et al.

(10) Patent No.: US 7,595,926 B2
(45) Date of Patent: Sep. 29, 2009

(54) INTEGRATED IMODS AND SOLAR CELLS ON A SUBSTRATE

(75) Inventors: Teruo Sasagawa, Los Gatos, CA (US); Lior Kogut, Haifa (IL); Ming-Hau Tung, San Francisco, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 62 days.

(21) Appl. No.: 11/773,757

(22) Filed: Jul. 5, 2007

(65) Prior Publication Data

US 2009/0009847 A1 Jan. 8, 2009

(51) Int. Cl.
*G02B 26/00* (2006.01)
*G09G 3/34* (2006.01)

(52) U.S. Cl. .......................... 359/291; 345/84; 345/85; 359/290

(58) Field of Classification Search ................ 345/32, 345/84, 85; 359/290, 291, 295
See application file for complete search history.

(56) References Cited

U.S. PATENT DOCUMENTS

| | | | |
|---|---|---|---|
| 4,441,791 A | 4/1984 | Hornbeck | |
| 4,571,603 A | 2/1986 | Hornbeck et al. | |
| 4,748,366 A | 5/1988 | Taylor | |
| 4,859,060 A | 8/1989 | Katagiri et al. | |
| 4,954,789 A | 9/1990 | Sampsell | |
| 5,083,857 A | 1/1992 | Hornbeck | |
| 5,216,537 A | 6/1993 | Hornbeck | |
| 5,226,099 A | 7/1993 | Mignardi et al. | |
| 5,489,952 A | 2/1996 | Gove et al. | |
| 5,526,172 A | 6/1996 | Kanack | |
| 5,530,240 A | 6/1996 | Larson et al. | |
| 5,550,373 A | 8/1996 | Cole et al. | |
| 5,551,293 A | 9/1996 | Boysel et al. | |
| 5,629,521 A | 5/1997 | Lee et al. | |
| 5,815,141 A | 9/1998 | Phares | |
| 6,040,937 A | 3/2000 | Miles | |
| 6,295,048 B1 | 9/2001 | Ward et al. | |
| 6,304,297 B1 | 10/2001 | Swan | |
| 6,307,194 B1 | 10/2001 | Fitzgibbons et al. | |
| 6,666,561 B1 | 12/2003 | Blakley | |

(Continued)

FOREIGN PATENT DOCUMENTS

EP  0 725 380  8/1996

(Continued)

OTHER PUBLICATIONS

Miles, "A New Reflective FPD Technology Using Interferometric Modulation," Journal of the SID 5/4, 1997, pp. 379-382.

(Continued)

*Primary Examiner*—David N Spector
(74) *Attorney, Agent, or Firm*—Knobbe Martens Olson & Bear, LLP

(57) ABSTRACT

Embodiments of the present invention relate to interferometric display devices comprising an interferometric modulator and a solar cell and methods of making thereof. In some embodiments, the solar cell is configured to provide energy to the interferometric modulator. The solar cell and the interferometric modulator may be formed above the same substrate. A layer of the solar cell may be shared with a layer of the interferometric modulator.

16 Claims, 19 Drawing Sheets

U.S. PATENT DOCUMENTS

| | | |
|---|---|---|
| 6,674,562 B1 | 1/2004 | Miles et al. |
| 6,819,469 B1 | 11/2004 | Koba |
| 6,829,132 B2 | 12/2004 | Martin et al. |
| 7,123,216 B1 | 10/2006 | Miles |
| 7,138,984 B1 | 11/2006 | Miles |
| 7,280,265 B2 | 10/2007 | Miles |
| 7,327,510 B2 | 2/2008 | Cummings et al. |
| 2002/0075555 A1 | 6/2002 | Miles |
| 2003/0112507 A1 | 6/2003 | Divelbiss et al. |
| 2003/0117382 A1 | 6/2003 | Pawlowski et al. |
| 2003/0128197 A1 | 7/2003 | Turner et al. |
| 2004/0024580 A1 | 2/2004 | Salmonsen et al. |
| 2006/0066503 A1 | 3/2006 | Sampsell et al. |
| 2006/0066504 A1 | 3/2006 | Sampsell et al. |
| 2006/0066543 A1 | 3/2006 | Gally et al. |
| 2006/0066595 A1 | 3/2006 | Sampsell et al. |
| 2006/0066596 A1 | 3/2006 | Sampsell et al. |
| 2006/0066876 A1 | 3/2006 | Kothari |
| 2006/0067028 A1 | 3/2006 | Floyd |
| 2006/0077393 A1 | 4/2006 | Gally et al. |
| 2006/0077521 A1 | 4/2006 | Gally et al. |
| 2006/0077617 A1 | 4/2006 | Floyd |
| 2006/0176241 A1 | 8/2006 | Sampsell |
| 2007/0024603 A1* | 2/2007 | Li ............................... 345/204 |
| 2007/0132843 A1 | 6/2007 | Miles |
| 2007/0147688 A1 | 6/2007 | Mathew |
| 2007/0200839 A1 | 8/2007 | Sampsell |
| 2007/0242008 A1 | 10/2007 | Cummings |
| 2009/0015579 A1* | 1/2009 | Nachman et al. ............ 345/212 |
| 2009/0040136 A1* | 2/2009 | Lan et al. ...................... 345/30 |
| 2009/0040590 A1* | 2/2009 | Sasagawa ................... 359/290 |
| 2009/0059345 A1* | 3/2009 | Tung et al. ................. 359/290 |
| 2009/0103161 A1* | 4/2009 | Kothari et al. .............. 359/245 |

FOREIGN PATENT DOCUMENTS

| | | | |
|---|---|---|---|
| EP | | 1 429 310 | 6/2004 |
| WO | WO 2004/066256 | | 8/2004 |
| WO | WO 2005/066596 | | 7/2005 |
| WO | WO 2006/026162 | | 3/2006 |
| WO | WO 2009/006122 A1 * | | 1/2009 ................. 359/291 |

OTHER PUBLICATIONS

Miles et al., 10.1: Digital Paper™ for reflective displays, SID 02 Digest, pp. 115-117, 2002.

Winton, John M., "A novel way to capture solar energy," Chemical Week, pp. 17-18 (May 15, 1985).

Wu, "Design of a Reflective Color LCD Using Optical Interference Reflectors," Asia Display '95, pp. 929-931 (Oct. 16, 1995).

Mark W. Miles, "MEMS-based interferometric modulator for display applications," Proceedings of SPIE, vol. 3876, Aug. 1999, pp. 20-28.

International Search Report & Written Opinion prepared for PCT/US08/068065, Jul. 10, 2008.

* cited by examiner

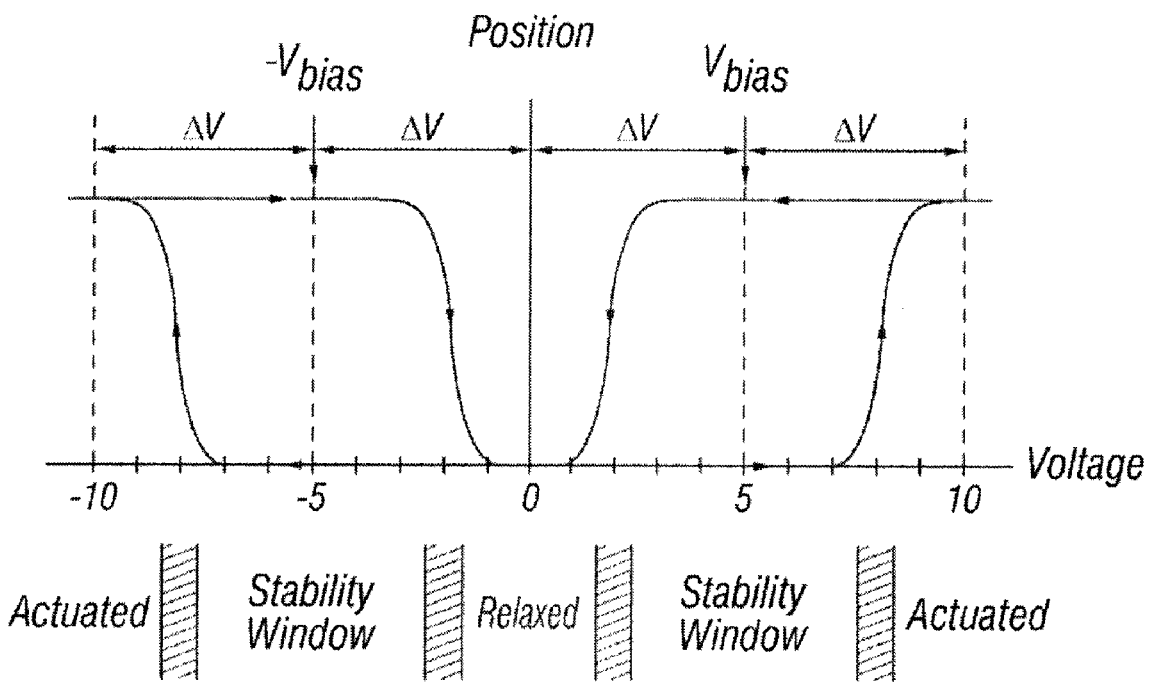
FIG. 3 *Prior Art*
FIG. 4 *Prior Art*

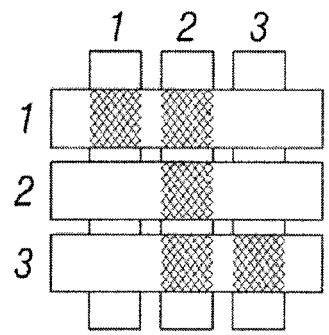
FIG. 5A  *Prior Art*
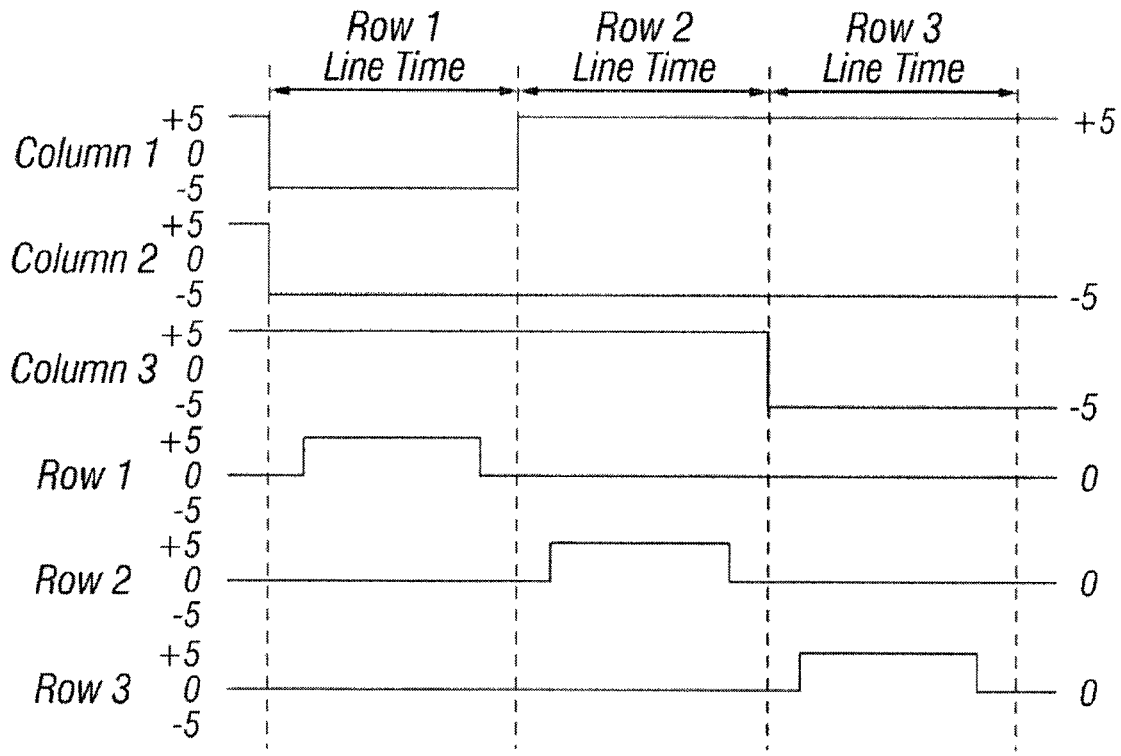
FIG. 5B  *Prior Art*

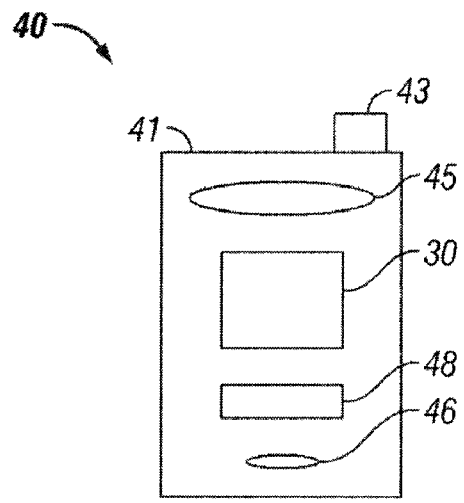
FIG. 6A *Prior Art*
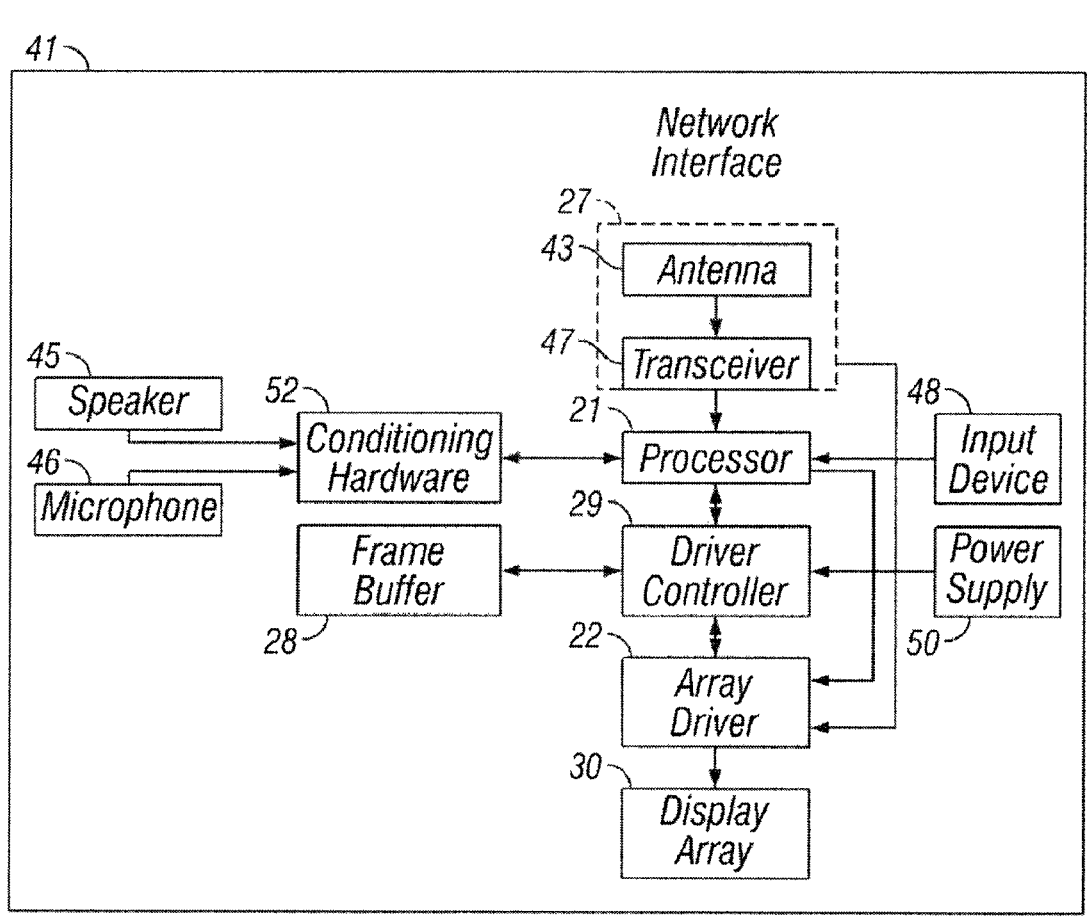
FIG. 6B *Prior Art*

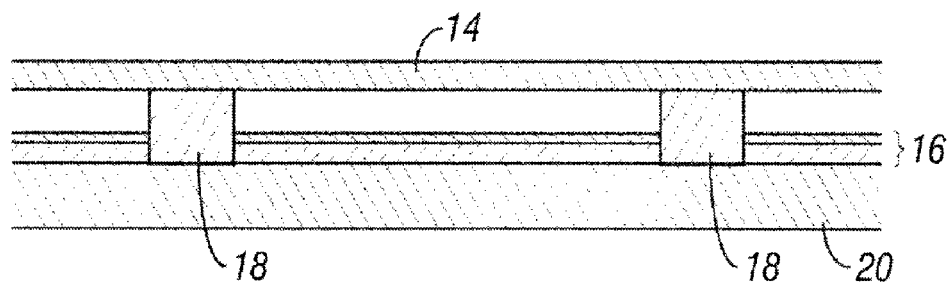
FIG. 7A *Prior Art*
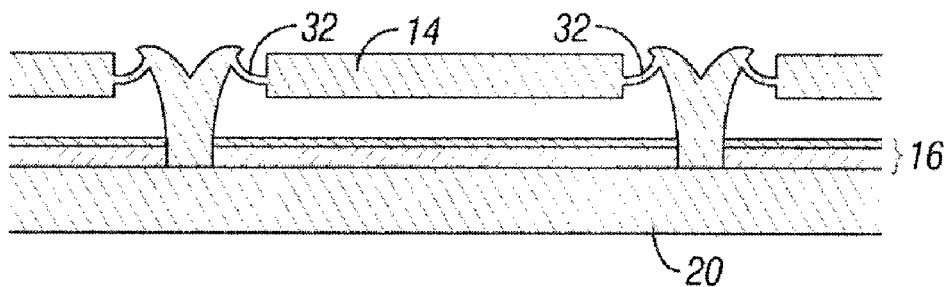
FIG. 7B *Prior Art*
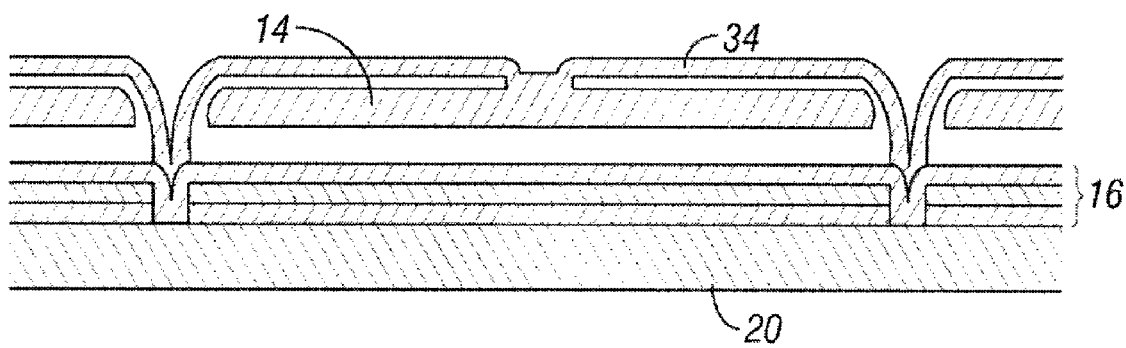
FIG. 7C *Prior Art*

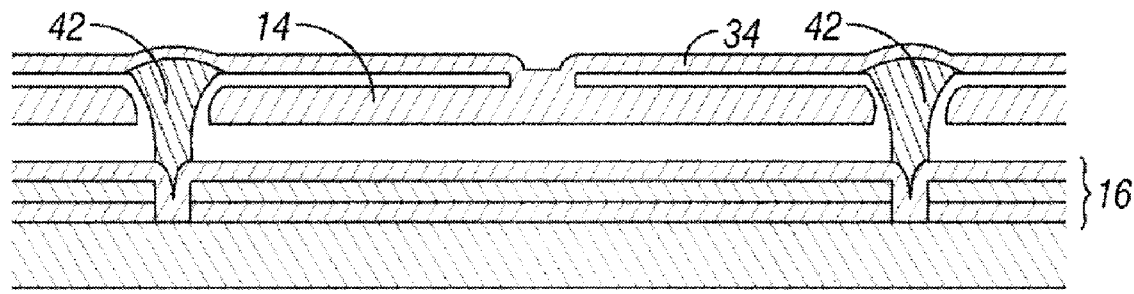
FIG. 7D   *Prior Art*
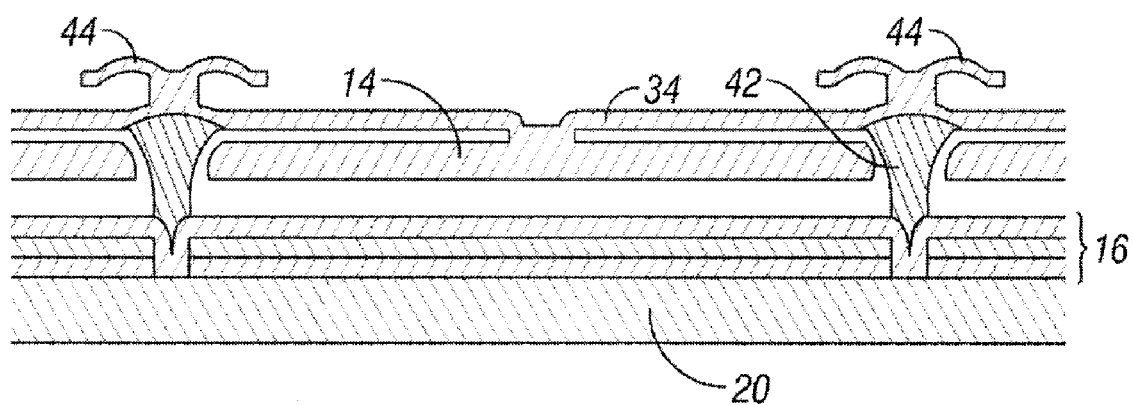
FIG. 7E   *Prior Art*

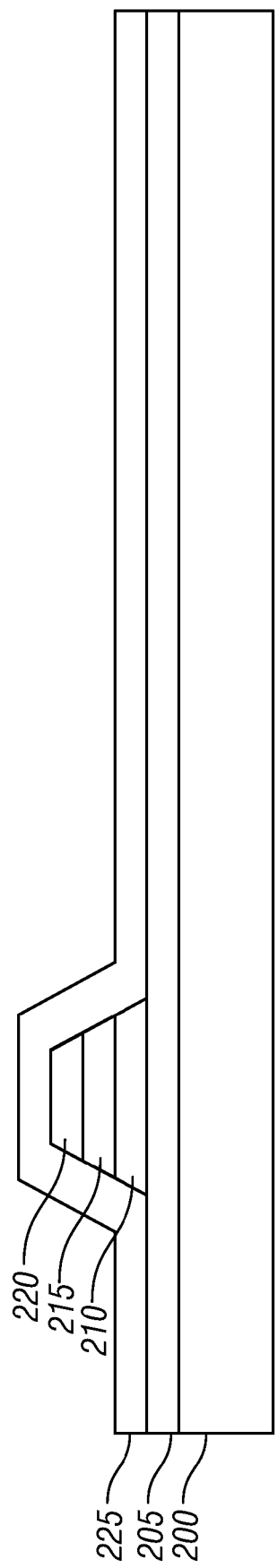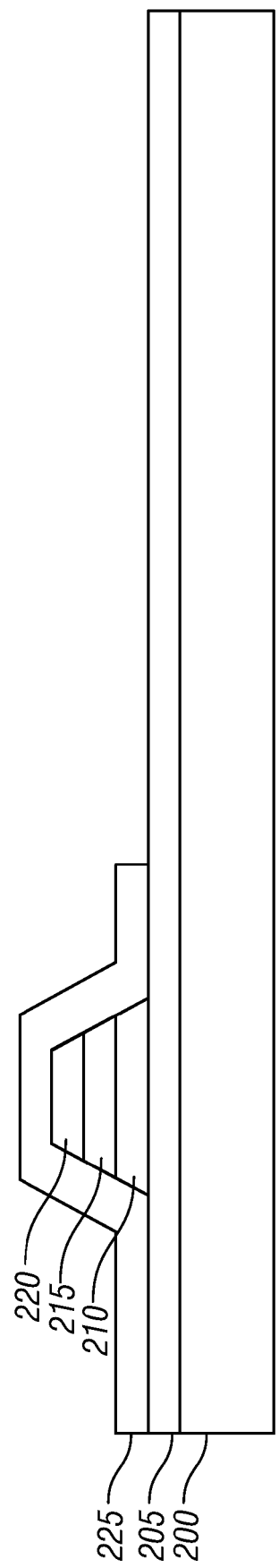

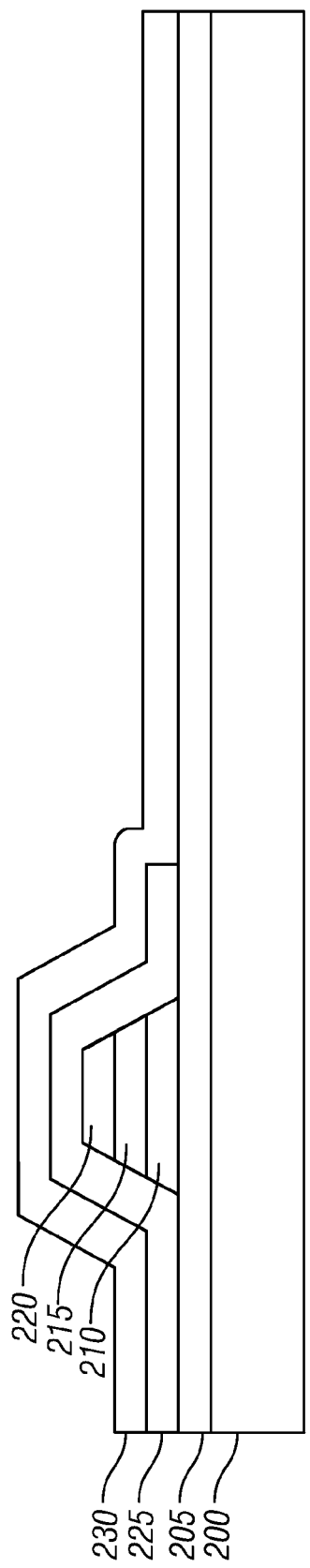
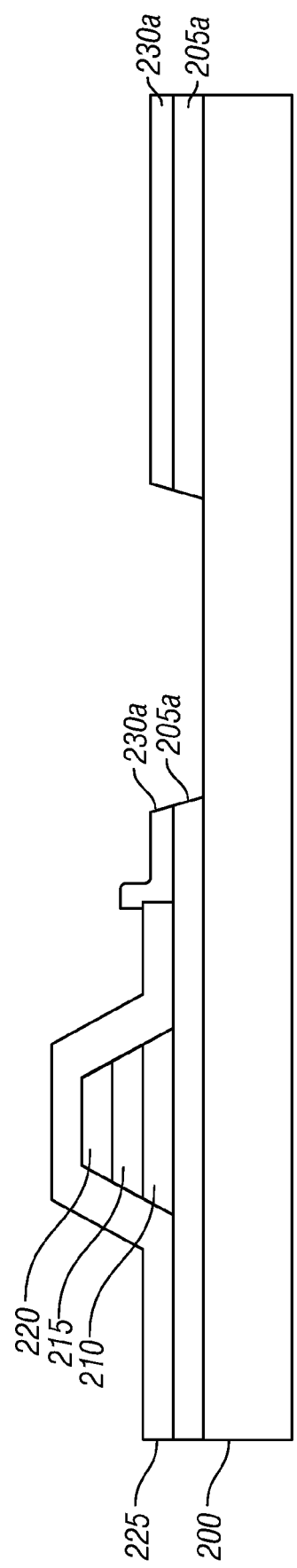

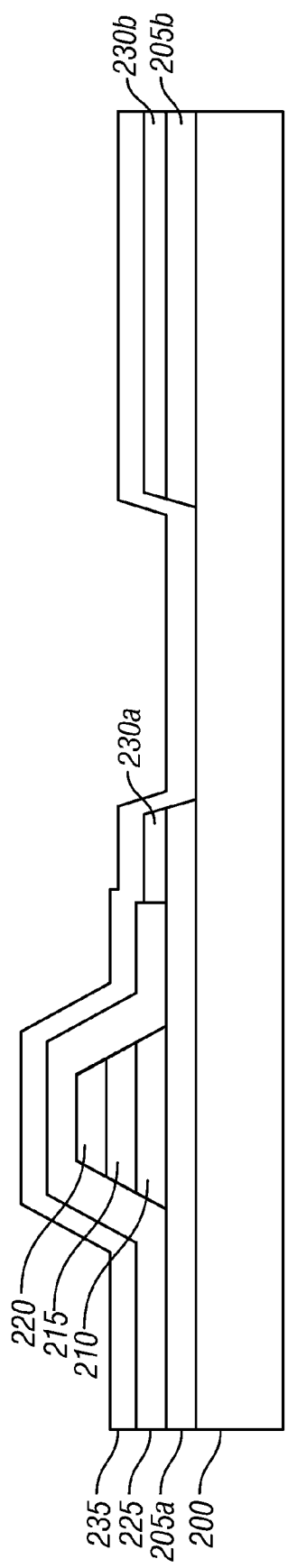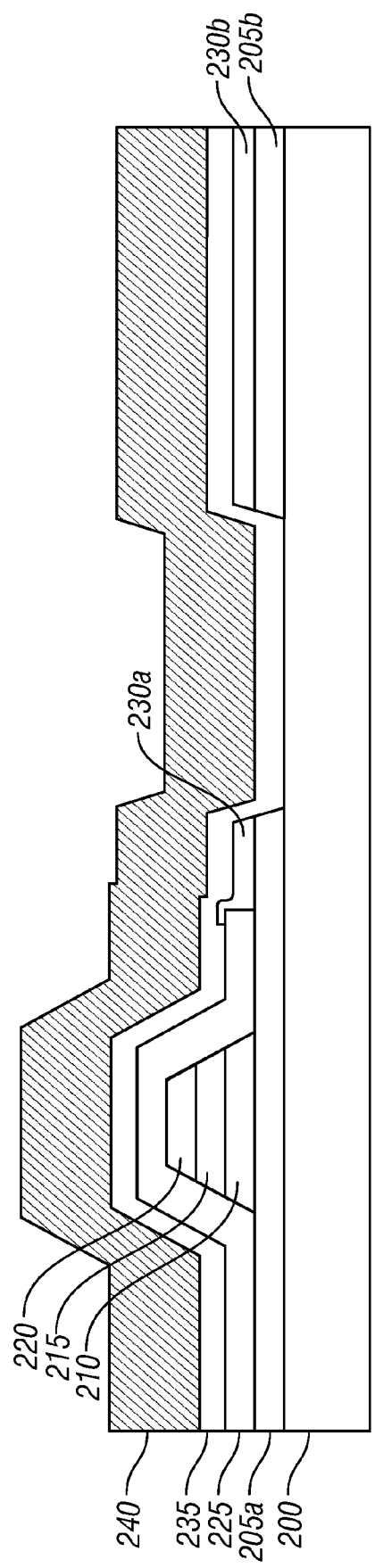

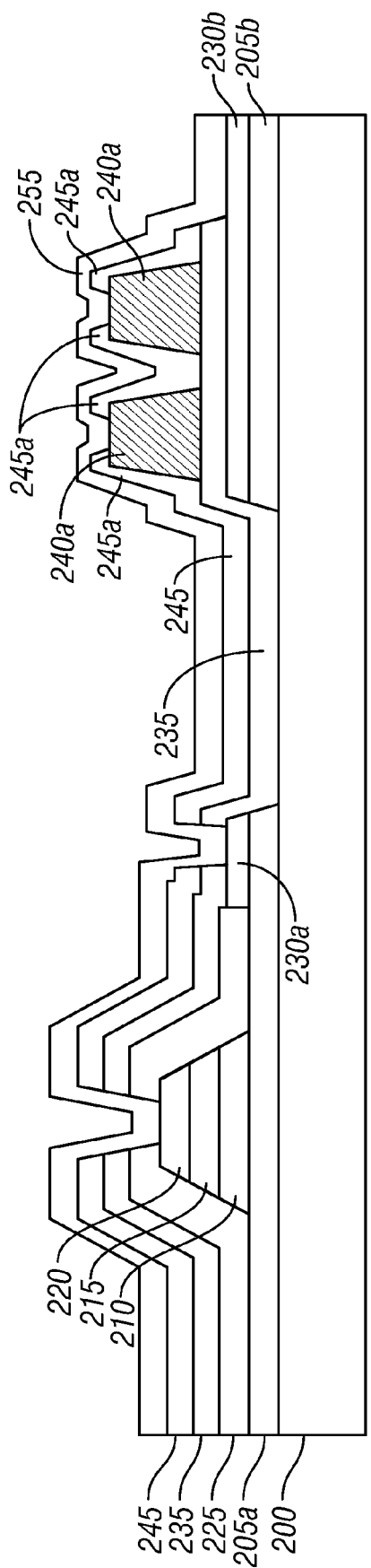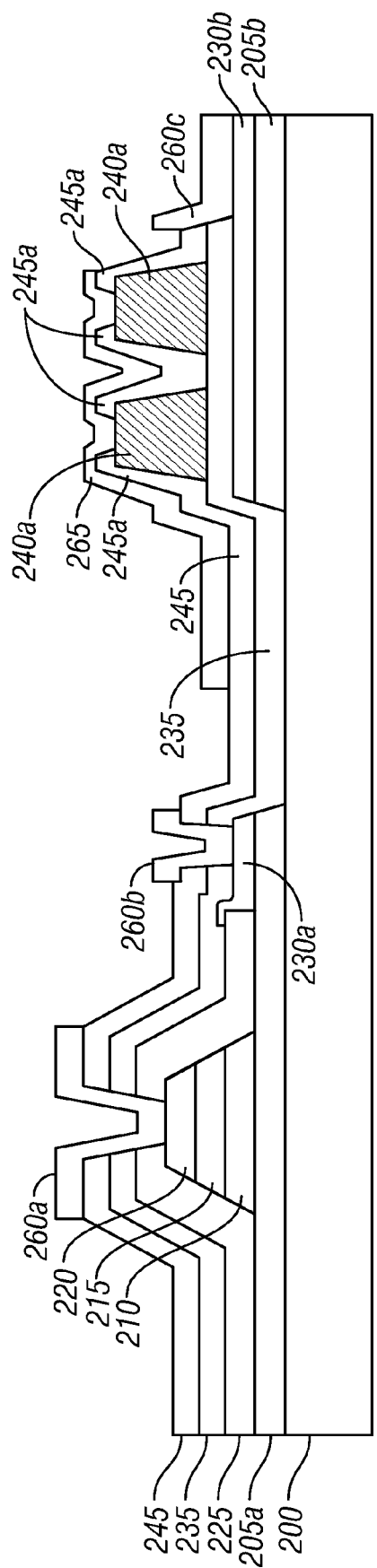

INTEGRATED IMODS AND SOLAR CELLS ON A SUBSTRATE

BACKGROUND

1. Field of the Invention

Embodiments of the present invention relate to interferometric display devices comprising a solar cell and methods of making thereof.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In some embodiments, a display device is provided, including an interferometric modulator; and a solar cell, wherein the solar cell is configured to provide energy for the interferometric modulator. The device may further include a capacitor, wherein the capacitor is configured to store energy from the solar cell and/or a battery, wherein the battery is configured to store energy from the solar cell. The device may include an array of interferometric modulators. The solar cell may be located between at least two of the interferometric modulators in the array and/or outside the perimeter of the array. At least one material of the interferometric modulator may be the same as at least one material of the solar cell. The at least one material of the interferometric modulator may be the same thickness as the at least one material of the solar cell. The at least one material of the interferometric modulator and the at least one material of the solar cell may include indium tin-oxide. An electrode layer of the interferometric modulator may include the at least one material of the interferometric modulator.

The device may further include a display comprising the interferometric modulator; a processor that is configured to communicate with said display, said processor being configured to process image data; and a memory device that is configured to communicate with said processor. The device may further include one or more of a driver circuit configured to send at least one signal to the display, a controller configured to send at least a portion of the image data to the driver circuit, an image source module configured to send said image data to the processor, and an input device configured to receive input data and to communicate said input data to the processor. The image source module may include at least one of a receiver, transceiver, and transmitter.

In some embodiments, a method of manufacturing an optical device is provided, which can include forming an interferometric device over a substrate, wherein the forming the interferometric device includes depositing multiple layers over the substrate; and forming a solar cell over the substrate, wherein the forming the solar cell includes depositing multiple layers over the substrate. The method may further include forming a shared layer between the solar cell and the interferometric modulator. The shared layer may be an operational layer, may include indium tin-oxide, and/or may include the electrode layer of the interferometric device.

The forming the interferometric device may include forming a first electrode layer over the substrate; forming a sacrificial layer over the first electrode; forming an electrode layer over the sacrificial layer; and removing at least a portion of the sacrificial layer. The forming the solar cell may include forming a p-doped layer over the substrate; forming an intrinsic layer over the p-doped layer; and forming an n-doped layer over the intrinsic layer.

A microelectromechanical (MEMS) device fabricated by a method disclosed herein.

In some instances, a method of using a solar cell is provided, which may include converting light energy into electrical energy using the solar cell; charging an energy storage device with the electrical energy; and connecting the energy storage device to an interferometric modulator; and providing energy from the energy storage device to the interferometric modulator. The energy storage device may be a battery. The solar cell and the interferometric modulator may be formed above the same substrate. The solar cell may share at least one layer with the interferometric modulator.

In some instances, a device including means for converting solar energy into electrical energy; means for interferometrically modulating light; and means for providing electrical energy to the interferometrically modulated means is provided. The device may further include a means for storing the electrical energy. The means for converting solar energy into electrical energy and the means for interferometrically modulating light may be formed on the same substrate.

In some instances, a computer readable medium is provided, which may include instructions for operating an interferometric modulator, the instructions comprising instructions for applying a time-varying voltage to an interferometric modulator, wherein the voltage is supplied by an energy storage device connected to a solar cell.

BRIEF DESCRIPTION OF THE DRAWINGS

FIG. 3 is a diagram of movable mirror position versus applied voltage for one exemplary embodiment of an interferometric modulator of FIG. 1.

FIG. 4 is an illustration of a set of row and column voltages that may be used to drive an interferometric modulator display.

FIG. 5A illustrates one exemplary frame of display data in the 3×3 interferometric modulator display of FIG. 2.

FIG. 5B illustrates one exemplary timing diagram for row and column signals that may be used to write the frame of FIG. 5A.

FIGS. 6A and 6B are system block diagrams illustrating an embodiment of a visual display device comprising a plurality of interferometric modulators.

FIG. 7A is a cross section of the device of FIG. 1.

FIG. 7B is a cross section of an alternative embodiment of an interferometric modulator.

FIG. 7C is a cross section of another alternative embodiment of an interferometric modulator.

FIG. 7D is a cross section of yet another alternative embodiment of an interferometric modulator.

FIG. 7E is a cross section of an additional alternative embodiment of an interferometric modulator.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Interferometric modulator displays require power to control electrode positions and thereby to control light reflectance of the device. In embodiments of the present invention, interferometric modulators are combined with solar cells. Methods are provided for forming interferometric modulators and solar cells on the same substrate.

Figure 1:
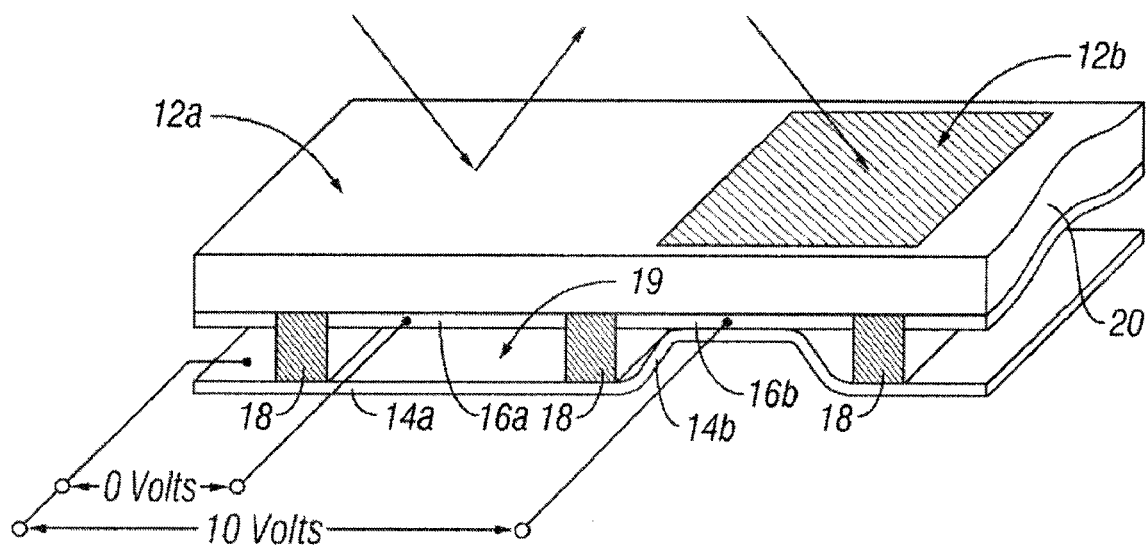
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
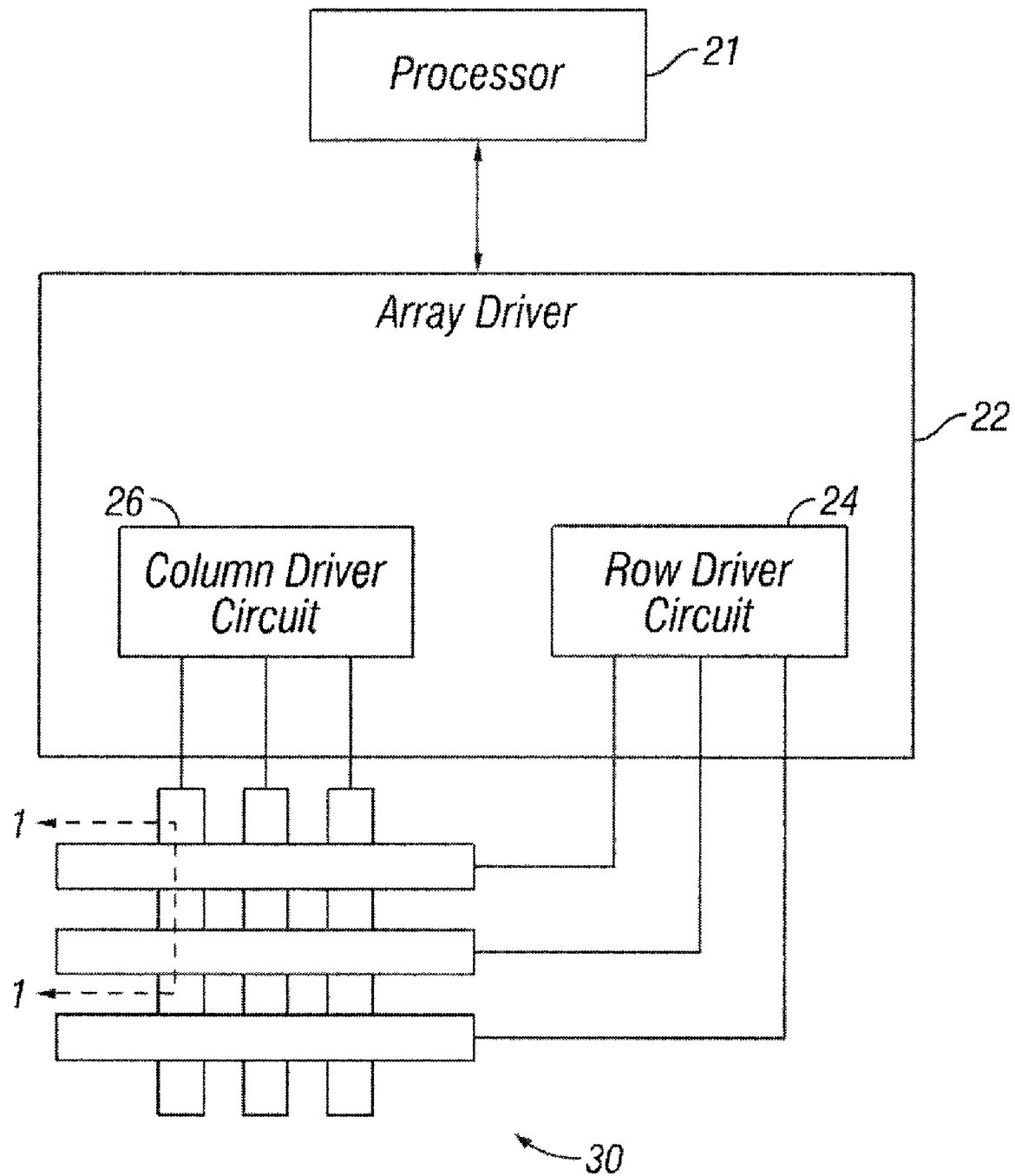
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to 1-5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 71) has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
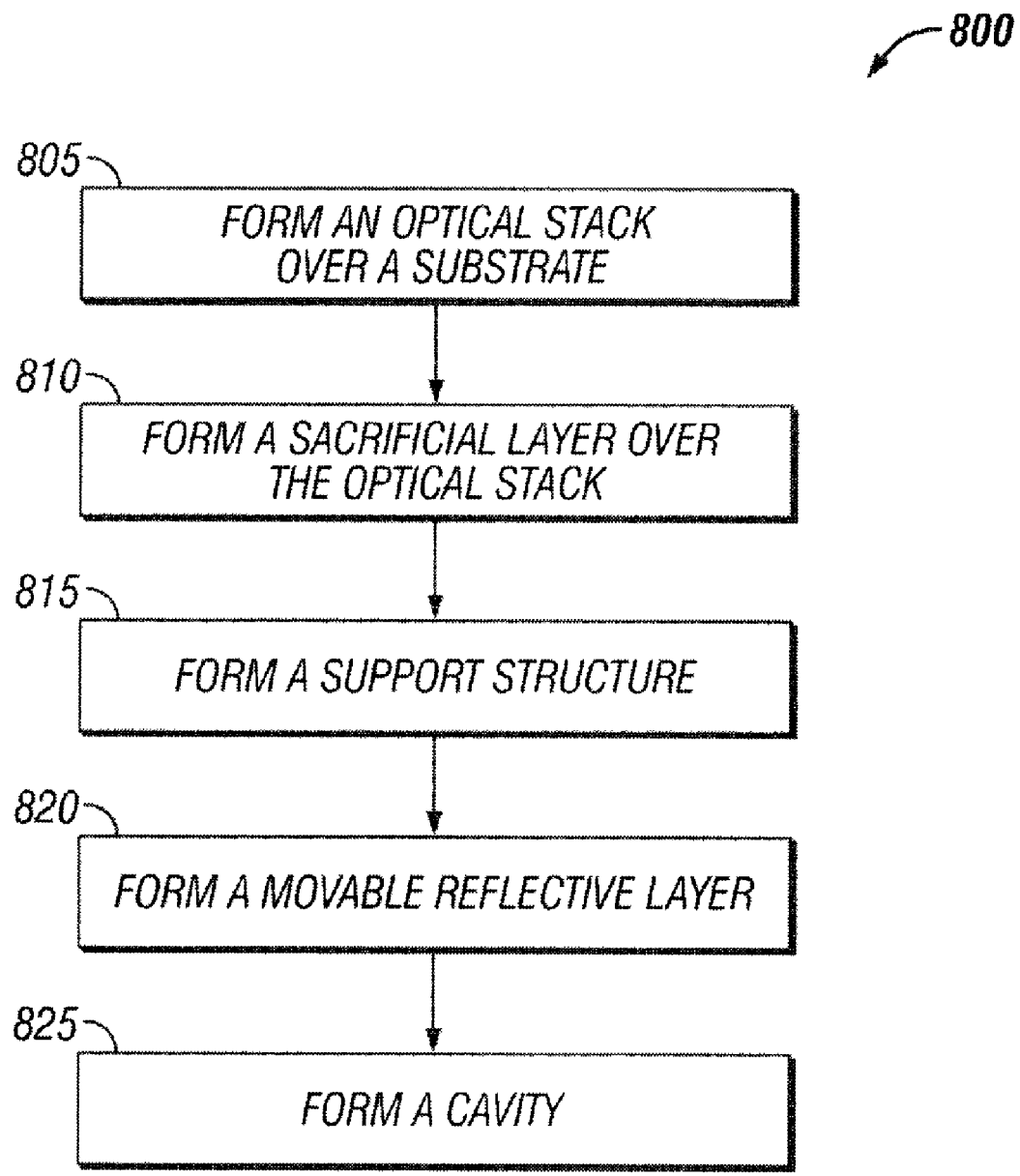
FIG. 8 is a flow diagram illustrating certain steps in an embodiment of method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers). In some embodiments, the insulating layer is the uppermost layer of the optical stack 16.

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. In some embodiments, the reflective layer comprises aluminum. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

Figure 9:
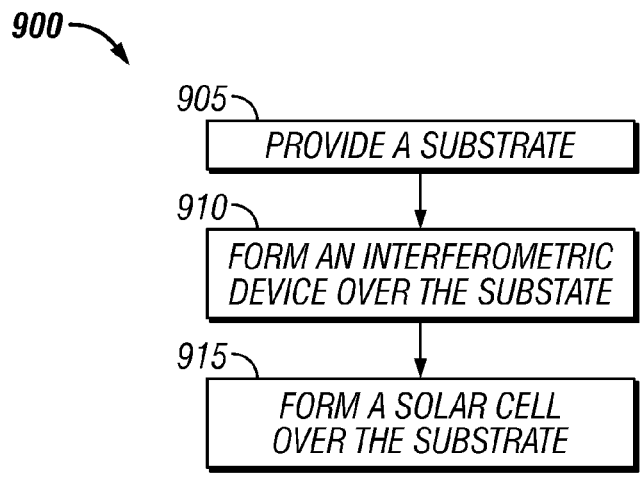
FIG. 9 is a flow diagram illustrating an embodiment of a method of making a MEMS device.

FIG. 9 illustrates certain steps in an embodiment of a manufacturing process 900 for a MEMS device. Such steps may be present in a process for manufacturing along with other steps not shown in FIG. 9. The process 900 begins at step 905 with the providing of a substrate. The substrate 20 may be a transparent substrate such as glass or plastic and may have been subjected to prior preparation step(s), e.g., cleaning. The process 900 continues at step 910 with the formation of an interferometric device over the substrate. The interferometric device may be formed, for example, by the process 800 or by any alternative manufacturing method. The process 900 continues at step 915 with the formation of a solar cell over the substrate. The solar cell may be formed by any suitable method. In some embodiments, at least part of step 910 occurs before step 915. In some embodiments, at least part of step 915 occurs before step 910. Step 910 may be completed before step 915 is begun or step 915 may be completed before step 910 is begun. In some embodiments, step 910 and 915 occur simultaneously.

In some embodiments, the solar cell and the interferometric device are formed on the same substrate, such that the solar cell is adjacent to the interferometric device. The interferometric device may comprise a material that is the same as a material comprised by the solar cell. The common material may be operational to both devices. That is, the common material may have some operational purpose for the functioning of both devices. In some embodiments, the interferometric device can comprise a layer of the same thickness and of the same material as a layer of the solar cell. The common material may again be operational to both devices. In some embodiments, a layer of the interferometric device is formed at substantially the same time as a layer of the solar cell.

In some embodiments, the interferometric device comprises an array of interferometric modulators. The solar cell may be positioned outside of the array of interferometric modulators. The device may comprise one or more than one solar cell.

In another embodiment, the solar cell and the interferometric device are formed on different substrates. The two substrates may then be directly or indirectly attached to each other. The substrates may be attached, for example, such that the interferometric device is adjacent to the solar cell. In another embodiment, the solar cell is positioned behind the interferometric device with respect to incident light. In some embodiments, one or more parts of the solar cell may be formed on one substrate and one or more parts of the interferometric device may be formed on another substrate. The two substrates may then be directly or indirectly attached to each other.

In some embodiments, the solar cell is configured to provide energy to the interferometric device. The solar cell may be configured to provide energy to one or more than one interferometric modulators. The solar cell may indirectly provide energy to the interferometric device by, for example, charging a battery or a capacitor. The battery or capacitor may be connected to the interferometric device.

Figure 10:
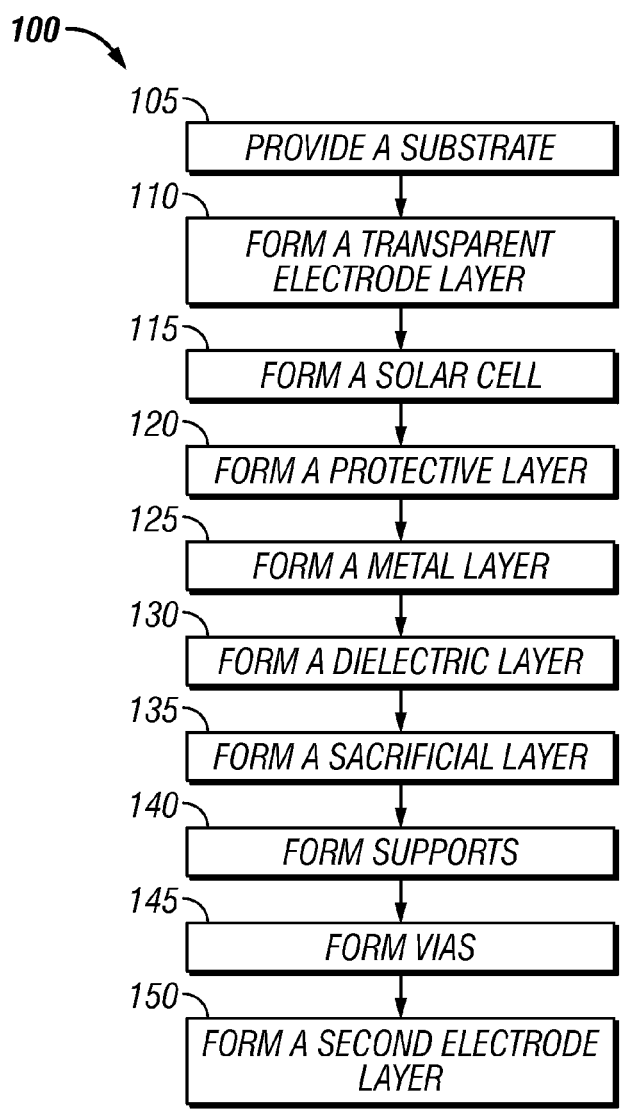
FIG. 10 is a flow diagram illustrating an embodiment of a method of making a MEMS device.
Figure 11A:
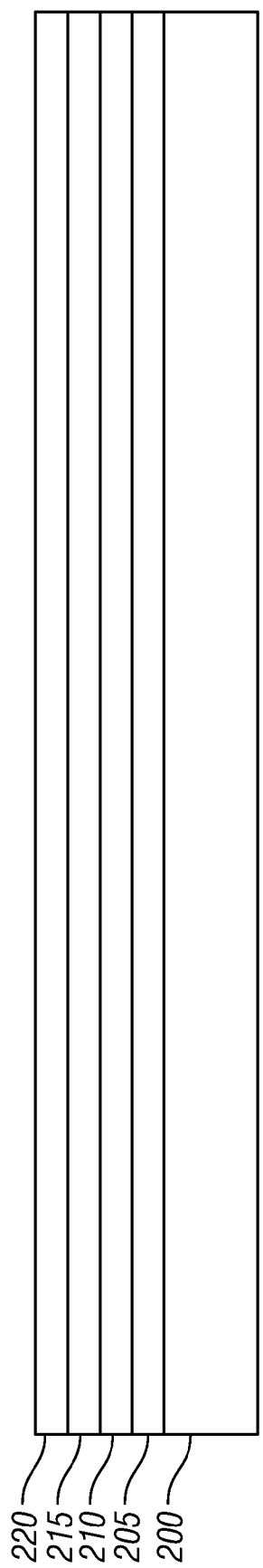
FIGS. 11A through 11O schematically illustrate an embodiment of a method for fabricating a MEMS device.

FIG. 10 is a flow diagram illustrating certain steps in an embodiment of a method of making a MEMS device. Such steps may be present in a process for manufacturing, along with other steps not shown in FIG. 10. FIGS. 11A through 11O schematically illustrate an embodiment of a method for fabricating a MEMS device using conventional semiconductor manufacturing techniques such as photolithography, deposition, masking, etching (e.g., dry methods such as plasma etch and wet methods), etc. Deposition may include "dry" methods such as chemical vapor deposition (CVD, including plasma-enhanced CVD and thermal CVD) and sputter coating, and wet methods such as spin coating.

With reference to FIGS. 10 and 11, the process 100 begins at step 105 with the providing of a substrate 200. The substrate 200 may be a transparent substrate such as glass or plastic and may have been subjected to prior preparation step(s), e.g., cleaning.

The process 100 continues at step 110 with the formation of a transparent electrode layer 205 over the substrate 200. The transparent electrode layer 205 may be fabricated, for example, by depositing an electrically conductive transparent material onto the substrate 200. The transparent electrode layer 205 may comprise, for example, indium tin oxide.

Figure 11B:
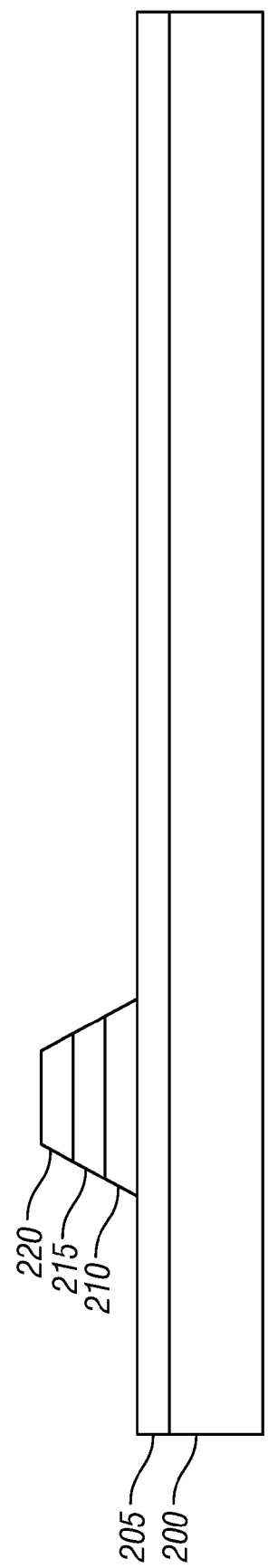

The process 100 continues at step 115 with the formation of a solar cell. The solar cell may be formed on or over the transparent electrode layer 205. In some embodiments, the solar cell is fabricated, for example, by depositing one or more of the layers onto the transparent electrode layer 205. In some embodiments, the solar cell includes a p-doped silicon layer and an n-doped silicon layer. In some embodiments, the silicon is amorphous silicon. In some embodiments, the solar cell comprises a bottom solar cell layer 210, a middle solar cell layer 215, and a top solar cell layer 220, as shown in FIG. 11A. The bottom solar cell layer 210 may comprise p-doped amorphous silicon. The middle solar cell layer 215 may comprise non-doped or intrinsic amorphous silicon. The top solar cell layer 220 may comprise n-doped amorphous silicon. In some embodiments, the solar cell layers 210, 215 and 220 comprise silicon instead of amorphous silicon or polysilicon instead of amorphous silicon. The bottom solar cell layer 210 may be, for example, about 50 to about 200 angstroms thick. The middle solar cell layer 215 may be, for example, about 3,000 to about 30,000 angstroms thick. The top solar cell layer 220 may be, for example, about 50 to about 200 angstroms thick. The solar cell layers 210, 215, and 220 can be patterned and etched to form an amorphous-silicon stack, as shown in FIG. 11B. The solar cell layers 210, 215 and 220 may be formed from any material(s) capable of photogeneration and separation of charge carriers, and may include fewer or more than three layers. Such layers may include, for example, poly-crystalline silicon, micro-crystalline silicon, cadmium telluride, copper indium selenide/sulfide, photo-electrochemical cells, polymers, nanocrystals or other nano particles. It will be understood that the solar cell need not be completely formed before step 120 begins.

The process 100 continues at step 120 with the formation of a protective layer 225, as shown in FIG. 11C. The protective layer 225 may comprise, for example, a silicon oxide ($SiO_x$), silicon nitride ($Si_xN_y$) or a silicon oxy-nitride ($SiO_xN_y$). The protective layer 225 may comprise an insulating material. The protective layer 225 can be patterned and etched, as shown in FIG. 11D. The etched protective layer 225 may continue to surround the solar cell.

The process 100 continues at step 125 with the formation of a metal layer 230, as shown in FIG. 11E. The metal layer 230 may comprise, for example, molybdenum, chromium, or molybdenum chromium material. The metal layer 230 may be, for example, about 50 angstroms to about 100 angstroms thick. The metal layer 230 and the transparent electrode layer 205 can be patterned and etched, as shown in FIG. 11F. The metal layer 230 may be patterned and etched before the transparent electrode layer 205 is patterned and etched. The transparent electrode layer 205 may be patterned and etched to form at least two components: a solar-cell electrode layer 205a located beneath the solar cell and an interferometric-modulator electrode layer 205b located at the position which the interferometric modulator will be formed. The metal layer 230 can be patterned and etched to form at least two components: a solar-cell metal layer 230a and an interferometric-modulator metal layer 230b. The solar-cell metal layer 230a may be above the solar-cell electrode 205a layer but adjacent to the solar cell. The interferometric-modulator metal layer 230b may be above the interferometric-modulator electrode layer 205b.

The process 100 continues at step 130 with the formation of a dielectric layer 235, as shown in FIG. 11G. The dielectric layer 235 may comprise, for example, an oxide. The dielectric layer 235 may comprise, for example, silicon oxide or aluminum oxide. The dielectric layer 235 may at least partially serve as an insulating layer.

Figure 11I:
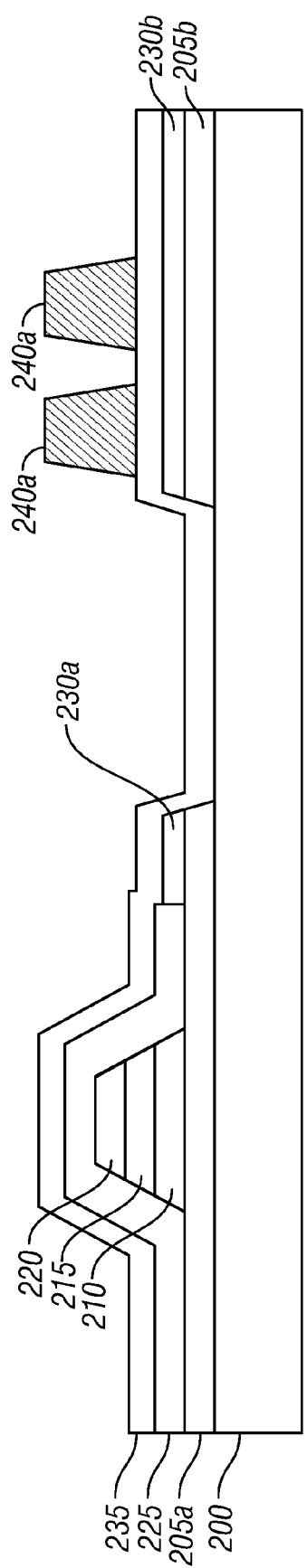

The process 100 continues at step 135 with the formation of a sacrificial layer 240, as shown in FIG. 11H. The sacrificial layer 240 is later removed to form the cavity 270a as discussed below and thus the sacrificial layer 240 is not shown in the resulting MEMS device. The formation of the sacrificial layer 240 over the dielectric layer 235 may include deposition of a $XeF_2$-etchable material such as molybdenum or amorphous silicon, in a thickness selected to provide, after subsequent removal, a cavity 270a having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating. The sacrificial layer 240 can be patterned and etched, as shown in FIG. 11I. The etched sacrificial layer may include sacrificial layer components 240a which are located where the cavities of the interferometric modulators are desired to be. In some instances, more than one sacrificial layer component 240a is formed, as shown in FIG. 11I. In other instances, only one sacrificial layer component 240a is formed.

Figure 11J:
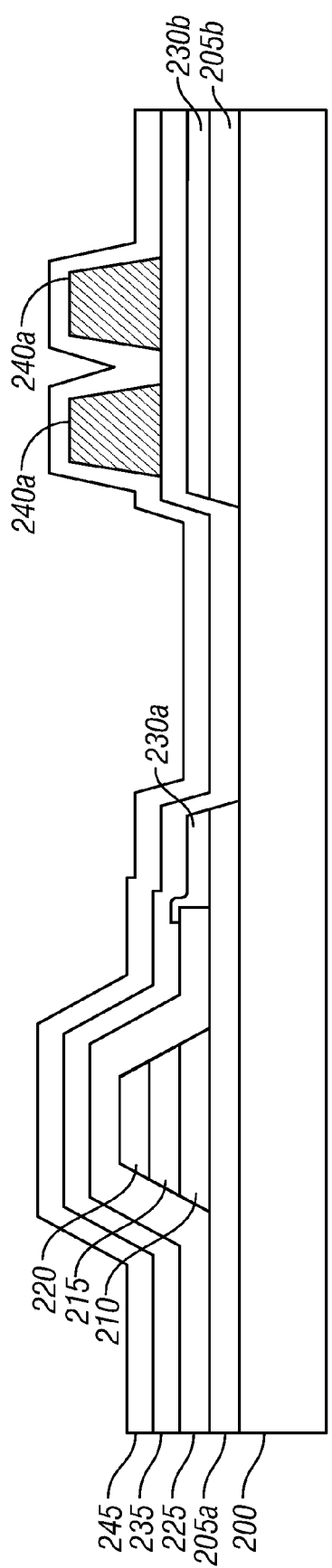
Figure 11K:
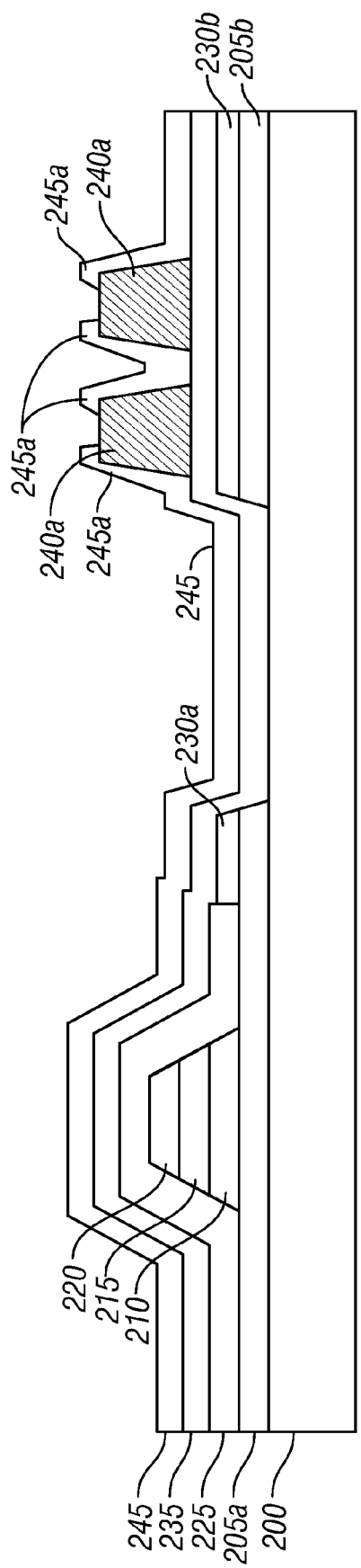

The process 100 continues at step 140 with the formation of supports 245a. The supports may be formed by first depositing a support layer 245, as shown in FIG. 11J. The support layer 245 may comprise, for example an oxide material. The support layer 245 may comprise a non-conductive material. The support layer 245 can be patterned and etched, as shown in FIG. 11K, to form one or more supports 245a. The supports 245a may be located adjacently to the sacrificial layer components 240a. The etching of the support layer 240 may comprise etching away at least a portion of the support layer 240 on top of the sacrificial layer components 240a.

Figure 11L:
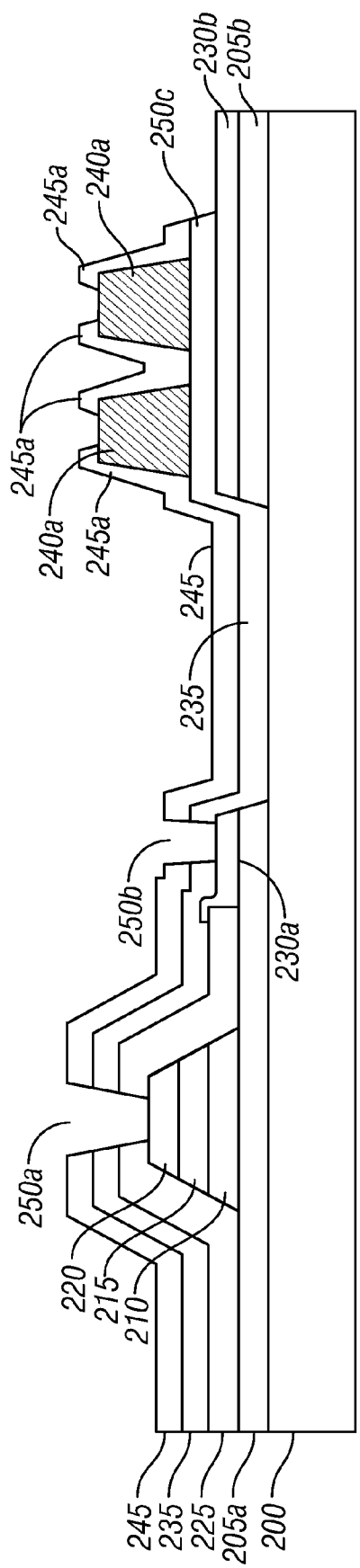
Figure 110:
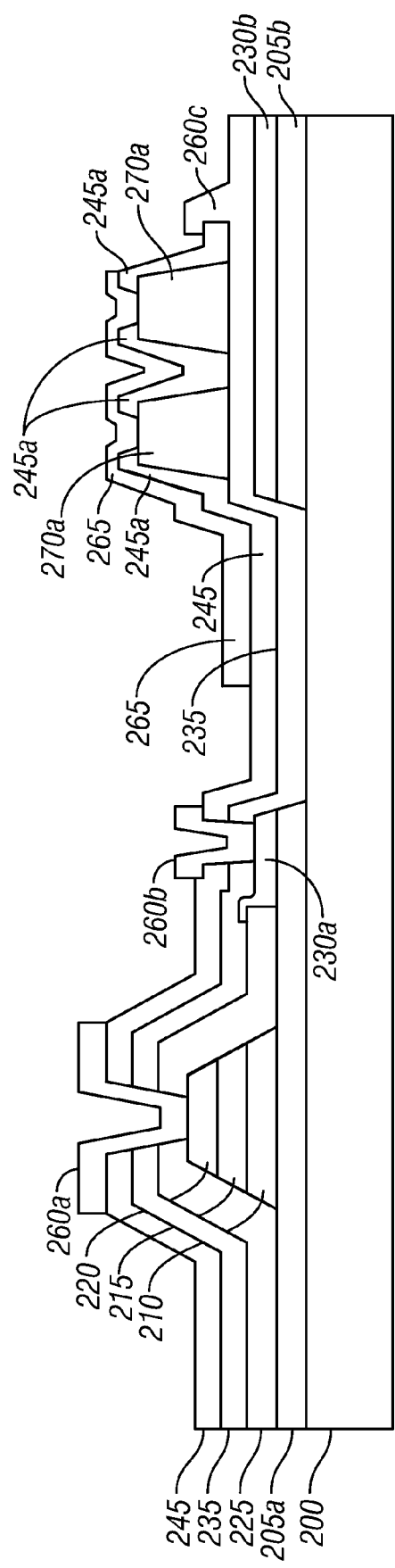

The process 100 continues at step 145 with the formation of vias 250a-250c, as shown in FIG. 11L. The vias 250a-250c may be formed by etching at least part of the layers on top of the solar cell, the solar-cell metal layer 230a and/or the interferometric-modulator metal layer 230b. In some embodiments, step 145 can be performed substantially simultaneously as step 140.

The process 100 continues at step 150 with the formation of a second electrode layer 255, as shown in FIG. 11M. The second electrode layer 255 may be electrically conductive. The second electrode layer 255 can be patterned and etched, as shown in FIG. 11N to form two solar cell electrodes 260a and 260b, at least one movable membrane 265 and an iMoD electrode 260c. The two solar cell electrodes 260a and 260b and the iMoD electrode 260c may be located over, and in some embodiments, in, the vias 250a-250c. The first solar cell electrode 260a may be located above, and in some embodiments, on, the solar cell stack. The second solar cell electrode 260b may be located above, and in some embodiments, on the solar-cell metal layer 230a. The iMoD electrode 260c may be located above, and in some embodiments, on the interferometric-modulator metal layer 230b. Since the sacrificial layer components 240a are still present, the at least one movable membrane 265 is typically not movable at this stage. The at least one movable membrane 265 may be located above, and in some embodiments, on the sacrificial layer components 240a. In some embodiments, a separate movable membrane 265 is positioned above, and in some embodiments, on each sacrificial layer component 240a. In some embodiments, none of the components formed from the second electrode layer 255 are in contact with each other. In some embodiments, none of the first solar cell electrode 260a, second solar cell electrode 260b, iMoD electrode 260c, and at least one movable membrane 265 directly contact each other.

One or more cavities 270a may be formed by exposing the sacrificial layer components 240a to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the one or more cavities 270a. Other etching methods, e.g. wet etching and/or plasma etching, may also be used. Removal of the sacrificial layer components 240a typically causes the at least one movable membrane 265 to be movable after this stage.

Variations such as the addition of steps, variations in etching, removal of steps, or reordering of steps may be made to the process 100. For example, the interferometric-modulator electrode layer 205b may be formed from a different initial layer than the solar-cell electrode layer 205a. As another example, the dielectric layer may be etched so that there is not a dielectric layer above the solar-cell electrode layer 205a. As yet another example, the solar cell electrodes 260a and 260b may be connected to charge a battery, which may be connected to the iMoD electrode 260c.

A variety of types of solar cells may be included in devices described herein. The above-described process 100 describes one type of solar cell, comprising layers which may be formed in step 215.

Figure 12A:
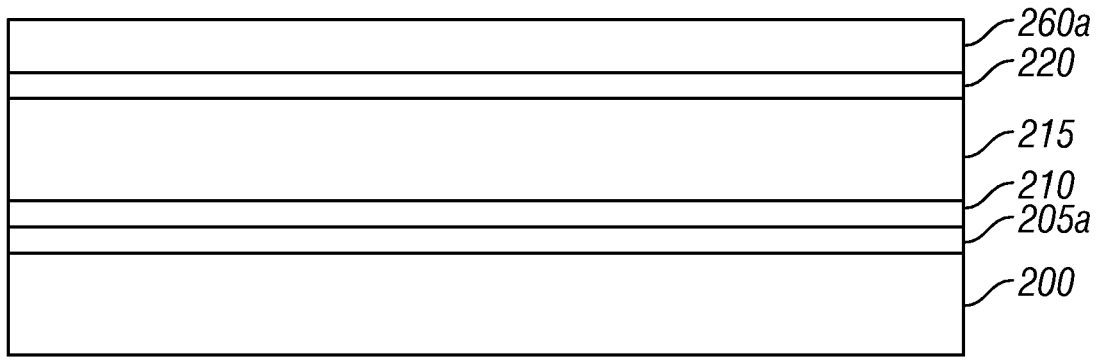
FIGS. 12A through 12C are cross sections of different solar cells.

In some embodiments, as shown in FIG. 12A, the solar cell is formed on a substrate and comprises a solar-cell electrode layer 205a, a bottom solar cell layer 210, a middle solar cell layer 215, a top solar cell layer 220, and a solar cell electrode 260a. In one embodiment, as recited above, the bottom solar cell layer 210 comprises p-doped amorphous silicon, the middle solar cell layer 215 comprises amorphous silicon, and the top solar cell layer 220 comprises n-doped amorphous silicon. In another embodiment, the bottom solar cell layer 210 comprises p-doped amorphous silicon carbide, the middle solar cell layer 215 comprises amorphous silicon, and the top solar cell layer 220 comprises n-doped amorphous silicon.

Figure 12B:
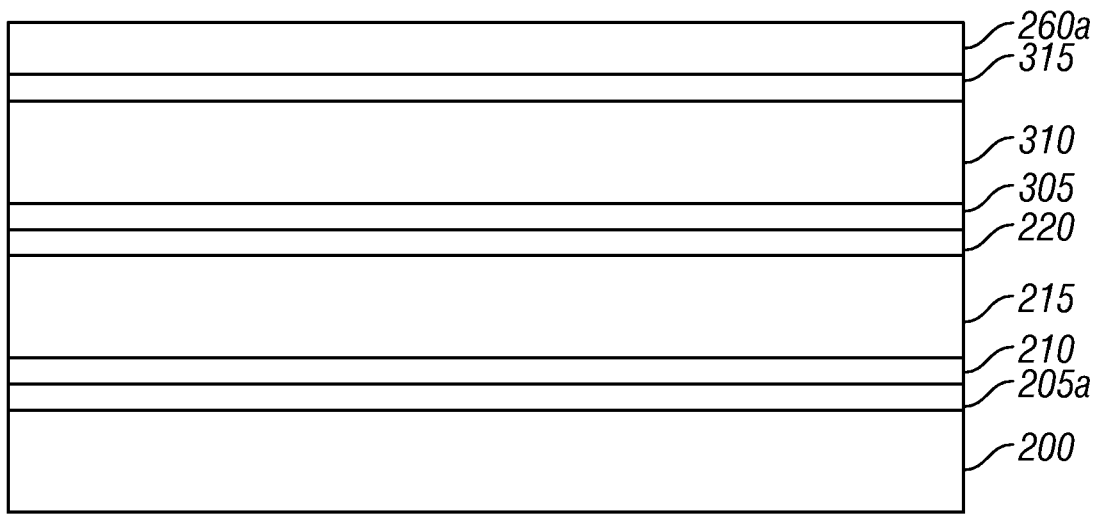

In some embodiments, as shown in FIG. 12B, the solar cell is formed on a substrate and comprises a solar-cell electrode layer 205a, a bottom solar cell layer 210, a middle solar cell layer 215, a top solar cell layer 220, a second bottom solar cell layer 305, a second middle solar cell layer 310, a second top solar cell layer 315, and a solar cell electrode 260a. The second bottom solar cell layer 305, second middle solar cell layer 310 and second top solar cell layer 315 may be positioned above the top solar cell layer 220 and below the solar cell electrode 260a. The bottom, middle, and top solar cell layers 210, 215, and 220 may comprise materials described above. The second bottom solar cell layer 305 may comprise p-doped amorphous silicon carbide. The second middle solar cell layer 310 may comprise amorphous silicon. The second top solar cell layer 315 may comprise n-doped amorphous silicon.

Figure 12C:
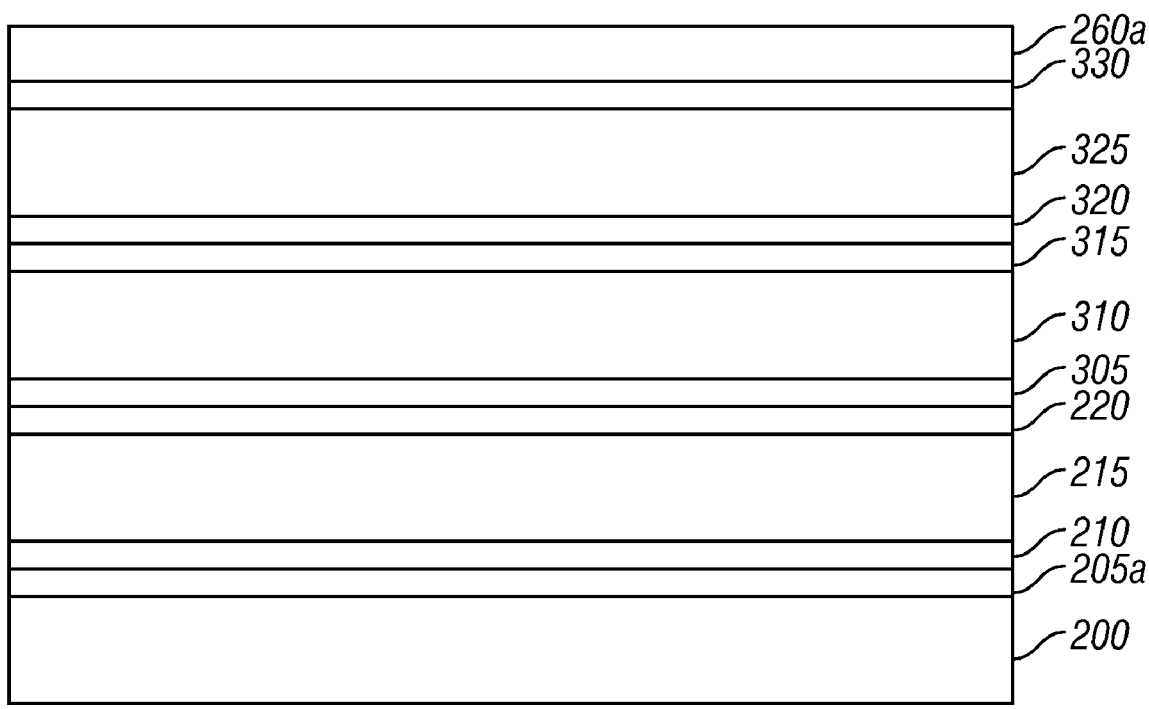

In some embodiments, as shown in FIG. 12C, the solar cell is formed on a substrate and comprises a solar-cell electrode layer 205a, a bottom solar cell layer 210, a middle solar cell layer 215, a top solar cell layer 220, a second bottom solar cell layer 305, a second middle solar cell layer 310, a second top solar cell layer 315, a third bottom solar cell layer 320, a third middle solar cell layer 325, a third top solar cell layer 330, and a solar cell electrode 260a. The third bottom solar cell layer 320, third middle solar cell layer 325 and third top solar cell layer 330 may be positioned above the second top solar cell layer 315 and below the solar cell electrode 260a. The bottom, middle, and top solar cell layers 210, 215, and 220 and the second bottom, middle, and top solar cell layers 305, 310, and 315 may comprise materials described above. The third bottom solar cell layer 320 may comprise p-doped amorphous silicon carbide. The third middle solar cell layer 325 may comprise amorphous silicon germanium. The third top solar cell layer 330 may comprise n-doped amorphous silicon.

It will be understood that other types of solar cells may be incorporated into a device described herein. In one embodiment, for example, the solar cell component of the device comprises a photocapacitor.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A display device, comprising:
   at least two interferometric modulators; and
   a solar cell, wherein the solar cell is configured to provide energy for at least one of the interferometric modulators and is located between the at least two interferometric modulators.

2. The device of claim 1, further comprising a capacitor, wherein the capacitor is configured to store energy from the solar cell.

3. The device of claim 1, further comprising a battery, wherein the battery is configured to store energy from the solar cell.

4. The device of claim 1, wherein the device comprises an array of interferometric modulators.

5. The device of claim 4, wherein the array comprises the at least two interferometric modulators.

6. The device of claim 4, wherein the solar cell is located outside the perimeter of the array.

7. The device of claim 1, wherein at least one material of the interferometric modulators is the same as at least one material of the solar cell.

8. The device of claim 7, wherein the at least one material of the interferometric modulators is the same thickness as the at least one material of the solar cell.

9. The device of claim 7, wherein the at least one material of the interferometric modulators and the at least one material of the solar cell comprise indium tin-oxide.

10. The device of claim 7, wherein an electrode layer of the interferometric modulators comprises the at least one material of the interferometric modulators.

11. The device of claim 1, further comprising:
    a display comprising the interferometric modulators;
    a processor that is configured to communicate with said display, said processor being configured to process image data; and
    a memory device that is configured to communicate with said processor.

12. The device of claim 11, further comprising a driver circuit configured to send at least one signal to the display.

13. The device of claim 12, further comprising a controller configured to send at least a portion of the image data to the driver circuit.

14. The device of claim 11, further comprising an image source module configured to send said image data to said processor.

15. The device of claim 14, wherein the image source module comprises at least one of a receiver, transceiver, and transmitter.

16. The device of claim 11, further comprising an input device configured to receive input data and to communicate said input data to said processor.

* * * * *

UNITED STATES PATENT AND TRADEMARK OFFICE
CERTIFICATE OF CORRECTION

PATENT NO. : 7,595,926 B2
APPLICATION NO. : 11/773757
DATED : September 29, 2009
INVENTOR(S) : Teruo Sasagawa, Lior Kogut and Ming-Hau Tung It is certified that error appears in the above-identified patent and that said Letters Patent is hereby corrected as shown below:

At Column 6, Line 40, please delete "-ΛV." and insert therefore, -- -ΔV.--.

At Column 6, Line 61, please delete "1-5" and insert therefore, --+5--.

Signed and Sealed this

Twenty-third Day of March, 2010

David J. Kappos
*Director of the United States Patent and Trademark Office*